United States Patent [19]
Ota

[11] Patent Number: 5,942,357
[45] Date of Patent: Aug. 24, 1999

[54] METHOD OF MEASURING BASELINE AMOUNT IN A PROJECTION EXPOSURE APPARATUS

[75] Inventor: Kazuya Ota, Tokyo, Japan

[73] Assignee: Nikon Corporation, Tokyo, Japan

[21] Appl. No.: 08/863,064

[22] Filed: May 23, 1997

[30] Foreign Application Priority Data

May 24, 1996 [JP] Japan ................. 8-130246

[51] Int. Cl.⁶ .................................................. G03F 9/00
[52] U.S. Cl. ........................................... 430/22; 430/30
[58] Field of Search ......................... 430/22, 30

[56] References Cited

U.S. PATENT DOCUMENTS

| | | | |
|---|---|---|---|
| 4,677,301 | 6/1987 | Tanimoto et al. | 250/548 |
| 4,710,026 | 12/1987 | Magome et al. | 356/349 |
| 4,780,616 | 10/1988 | Nishi et al. | 250/548 |
| 4,869,999 | 9/1989 | Fukuda et al. | 430/311 |

FOREIGN PATENT DOCUMENTS

| | | |
|---|---|---|
| 0 484 131 A2 | 5/1992 | European Pat. Off. . |
| 60-130742 | 7/1985 | Japan . |
| 61-215905 | 9/1986 | Japan . |
| 63-42122 | 2/1988 | Japan . |
| 63-81818 | 4/1988 | Japan . |

*Primary Examiner*—Christopher G. Young
*Attorney, Agent, or Firm*—Morgan, Lewis & Bockius LLP

[57] ABSTRACT

Provided is a method of aligning a substrate pattern on a photosensitive surface of a substrate with an image of a mask pattern to be formed on the photosensitive surface by an exposing radiation flux through a projection optical system in a projection exposure apparatus, using an alignment sensor system detecting a positional relationship between the substrate pattern and the image. The method includes the steps of moving the photosensitive surface of the substrate to a plurality of first positions relative to a focal plane at which a focused image of the mask pattern is to be formed through the projection optical system, the plurality of first positions being disposed adjacent the focal plane in a first direction substantially normal to the focal plane, the photosensitive surface of the substrate being substantially parallel to the focal plane at each of the first positions; outputting calibration signals from the alignment sensor system at each of the first positions of the photosensitive surface of the substrate, the calibration signals indicating an offset amount to be used to calibrate the alignment sensor system at each of the first positions; detecting a position of the substrate pattern relative to the image of the mask pattern to be formed on the substrate using the alignment sensor system in accordance with the calibration signals; and aligning the substrate pattern with the image of the mask pattern to be formed in the focal plane in accordance with the detected position of the substrate pattern relative to the image of the mask pattern.

15 Claims, 7 Drawing Sheets

METHOD OF MEASURING BASELINE AMOUNT IN A PROJECTION EXPOSURE APPARATUS

This application claims the benefit of Japanese Application No. 8-130246, filed on May 24, 1996, which is hereby incorporated by reference.

BACKGROUND OF THE INVENTION

1. Field of the Invention

The present invention relates to an exposure apparatus, and more particularly, to a projection exposure apparatus, which projects and exposes a semiconductor circuit pattern or a liquid crystal display element pattern on the reticle onto a photosensitive substrate.

2. Discussion of the Related Art

Semiconductor integrated circuits or the liquid crystal displays are commonly manufactured by repeating several times or more the processes of film formation, circuit pattern exposure, etching, and the like. For this reason, a projection exposure apparatus needs to align an exposing pattern on a reticle with the existing pattern on a photosensitive substrate (such as a semiconductor wafer or a glass plate coated with a photoresist layer) with high accuracy upon exposure. To achieve this, the projection exposure apparatus detects the position (and rotation) of the photosensitive substrate (wafer) and the position of the circuit pattern on the reticle using various alignment sensors at the time of the pattern exposure.

The optical systems of these alignment sensors are set at a predetermined position with respect to a reference point in the exposure area of the projection lens PL (for example, the center of the exposure field). The predetermined position may, however, deviates from the design value due to errors in manufacture, temperature variation, and changes in dimensions that may occur over time. When the distance between this reference point (center of exposure) and a reference point in the detection area of the alignment sensor (this distance or positional relationship is referred to as baseline amount or baseline length) is not known exactly, alignment accuracy suffers. Thus, the projection exposure apparatus is equipped with a fiducial mark FM installed at the same height as the wafer to measure the baseline amounts for the various alignment optical systems under the condition that the surface of the fiducial mark FM is matched with the best imaging plane (conjugate plane to the reticle) of the projection lens PL. The baseline amount is measured every time the reticle is replaced by a new one and before the first pattern is exposed using the new reticle.

Additionally, due to the several times or more of the repeated processes, such as film formation, circuit pattern exposure, etching, and the like, the surface of wafer typically has an area where several layers of films are laminated and an area where no films are laminated in the course of such processes. The thickness of one layer is about 0.1~1 $\mu$m, and thus the level difference in the wafer surface (within one shot area) may become as much as a few $\mu$m.

On the other hand, the focal depth $\Delta Z$ of the projection lens PL is in general expressed by $\pm \lambda/(2 \cdot NA \cdot Na)$, where $\lambda$ is the wavelength of the exposure illumination light, and NA is the numerical aperture of the projection lens on the image plane side. The projection lens PL having NA about 0.5 has been manufactured for use of a KrF excimer laser ($\lambda$=0.248 $\mu$m), and the focal depth $\Delta Z$ for this lens is approximately $\pm 0.50$ $\mu$m (width 1.0 $\mu$m). When exposure is performed on the wafer that is positioned to the best imaging plane of the projection lens and the level difference on the wafer is a few $\mu$m, the surface level difference of the wafer exceeds the focal depth of $\pm 0.50$ $\mu$m of the best imaging plane (best focal plane). In this case, image formation becomes impossible. This is a problem especially when exposing contact holes.

To solve this, Japanese Laid-Open Publication No. 63-42122 discloses an apparatus which increases an effective focal depth by performing multiple exposure of the same reticle pattern while elevating the wafer to two to three positions in the direction parallel to the optical axis of the projection lens PL (multiple level exposure). In addition, Japanese Laid-Open Publication No. 5-13305 discloses an apparatus which magnifies the effective focal depth 1.5 to 2 times by exposing the same reticle while moving the wafer W by an amount of $\pm\Delta Z$ (focal depth) at a variable speed in the Z direction of the projection lens.

There are, however, cases where the optical axis of the projection lens PL is not precisely telecentric in the image space between the projection lens PL and the wafer W. For example, FIG. 5 shows the case where the optical axis OA of the projection lens PL is bent (or curved) in the shape of a left bracket "<."

Suppose that the projection lens PL has the depth of focus (DOF) $\Delta Z$ (e.g., about 1.0 $\mu$m) and contact holes are exposed by moving the wafer in the Z direction (optical axis direction) relative to the best-focus position Zc. Then, as shown in FIG. 6, which is a magnified view of a portion of FIG. 5 adjacent the wafer, the optical axis OA deviates from the ideal telecentric optical axis IOA by an amount $\delta 1$ at the best-focus position Zc. On the other hand, when moving the wafer W in the Z direction from the position that is the focal depth amount lower than the best focus position (Zc−$\Delta Z$) to the position that is the focal depth amount higher than the best focus position (Zc+$\Delta Z$), the average displacement amount becomes $\delta 2$. As shown in the figure, in the case of the bent (or curved) optical axis OA, $\delta 1$ and $\delta 2$ do not coincide with each other.

In addition, there are also cases where an optical axis forming the reference point in the detection area of an alignment sensor also bends into the shape of a left bracket "<" between the position Zc−$\Delta Z$ (which is a focal depth amount lower than the best focus position) and the position Zc+$\Delta Z$ (which is a focal depth amount higher than the best focus position).

Accordingly, if the baseline amount is measured only at the best focus position of the projection lens, alignment errors occur when exposing contact holes by moving the wafer in the Z direction (optical axis direction). In addition, not only in measurement of the baseline amount, but also in an enhanced global alignment (EGA), which statistically processes the positions of alignment marks in a plurality of predetermined shot areas in the wafer to determine the position of the entire wafer, these alignment errors are being included in the result.

SUMMARY OF THE INVENTION

Accordingly, the present invention is directed to a projection exposure apparatus that substantially obviates the problems due to limitations and disadvantages of the related art.

An object of the present invention is to improve the accuracy of baseline measurement for alignment sensors and the accuracy of EGA measurement in a projection apparatus.

Another object of the present invention is to provide a method of measuring a baseline amount for each of the alignment sensors in a projection exposure apparatus, which is more accurate than the conventional baseline measurement and suitable for exposing contact holes or the like through elevating the wafer in the direction of the optical axis of the projection lens PL.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a method of aligning a substrate pattern on a photosensitive surface of a substrate with an image of a mask pattern to be formed on the photosensitive surface by an exposing radiation flux through a projection optical system in a projection exposure apparatus, using an alignment sensor system detecting a positional relationship between the substrate pattern and the image, the method including the steps of moving the photosensitive surface of the substrate to a plurality of first positions relative to a focal plane at which a focused image of the mask pattern is to be formed through the projection optical system, the plurality of first positions being disposed adjacent the focal plane in a first direction substantially normal to the focal plane, the photosensitive surface of the substrate being substantially parallel to the focal plane at each of the first positions; outputting calibration signals from the alignment sensor system at each of the first positions of the photosensitive surface of the substrate, the calibration signals indicating an offset amount to be used to calibrate the alignment sensor system at each of the first positions; detecting a position of the substrate pattern relative to the image of the mask pattern to be formed on the substrate using the alignment sensor system in accordance with the calibration signals; and aligning the substrate pattern with the image of the mask pattern to be formed in the focal plane in accordance with the detected position of the substrate pattern relative to the image of the mask pattern.

In another aspect, the present invention provides a method of aligning a substrate pattern on a photosensitive surface of a substrate with an image of a mask pattern to be formed on the photosensitive surface by an exposing radiation flux through a projection optical system in a projection exposure apparatus, the method including the steps of moving the photosensitive surface of the substrate to a plurality of first positions relative to a focal plane at which a focused image of the mask pattern is to be formed through the projection optical system, the plurality of first positions being disposed adjacent the focal plane in a first direction substantially normal to the focal plane, the photosensitive surface of the substrate being substantially parallel to the focal plane at each of the first positions; outputting position signals indicating positions of a plurality of alignment marks formed in the substrate pattern on the substrate at each of the first positions of the photosensitive surface; processing the position signals to derive a position of the substrate pattern; and aligning the substrate pattern with the image of the mask pattern to be formed in the focal plane in accordance with the derived position of the substrate pattern in the step of processing.

In another aspect, the present invention provides a baseline measurement method in a projection exposure apparatus for measuring a positional relationship between a first reference point for an alignment sensor detecting a position of an alignment mark on a photosensitive substrate with respect to the reference point and a second reference point in a projection area of a projection optical system projecting an image of a mask pattern on the photosensitive substrate, the baseline measurement method including the steps of detecting a position of a focused image formed through the projection optical system; and moving the photosensitive substrate relative to the detected position of the focused image in a direction substantially parallel to an optical axis of the projection optical system adjacent the focused image within a predetermined range while confirming a position of the first reference point for the alignment sensor relative to the second reference point in the projection area of the projection optical system.

In another aspect, the present invention provides a position determination method for determining a position of a photosensitive substrate by measuring positions of a plurality of shot areas on a photosensitive substrate by an alignment sensor and by statistically processing the measured positions of the shot areas and design positions of the shot areas using a least squares method, the position determination method including the steps of detecting a position of a focused image formed through the projection optical system; and moving the photosensitive substrate relative to the detected position of the focused image in a direction substantially parallel to an optical axis of the projection optical system adjacent the focused image within a predetermined range while confirming the positions of the plurality of shot areas.

In a further aspect, the present invention provides a projection exposure apparatus for use in projecting a focused image of a mask pattern onto a photosensitive substrate, the apparatus including a projection optical system forming the focused image of the mask pattern on the photosensitive substrate, the projection optical system having an optical axis; a focus detector detecting a position of the image of the mask pattern; a driving system for moving the photosensitive substrate relative to the detected position of the focused image in a direction substantially parallel to the optical axis of the projection optical system within a predetermined range including the position of the focused image; and a position detector detecting positions of the photosensitive substrate while the photosensitive substrate is moved by the driving system within the predetermined range.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
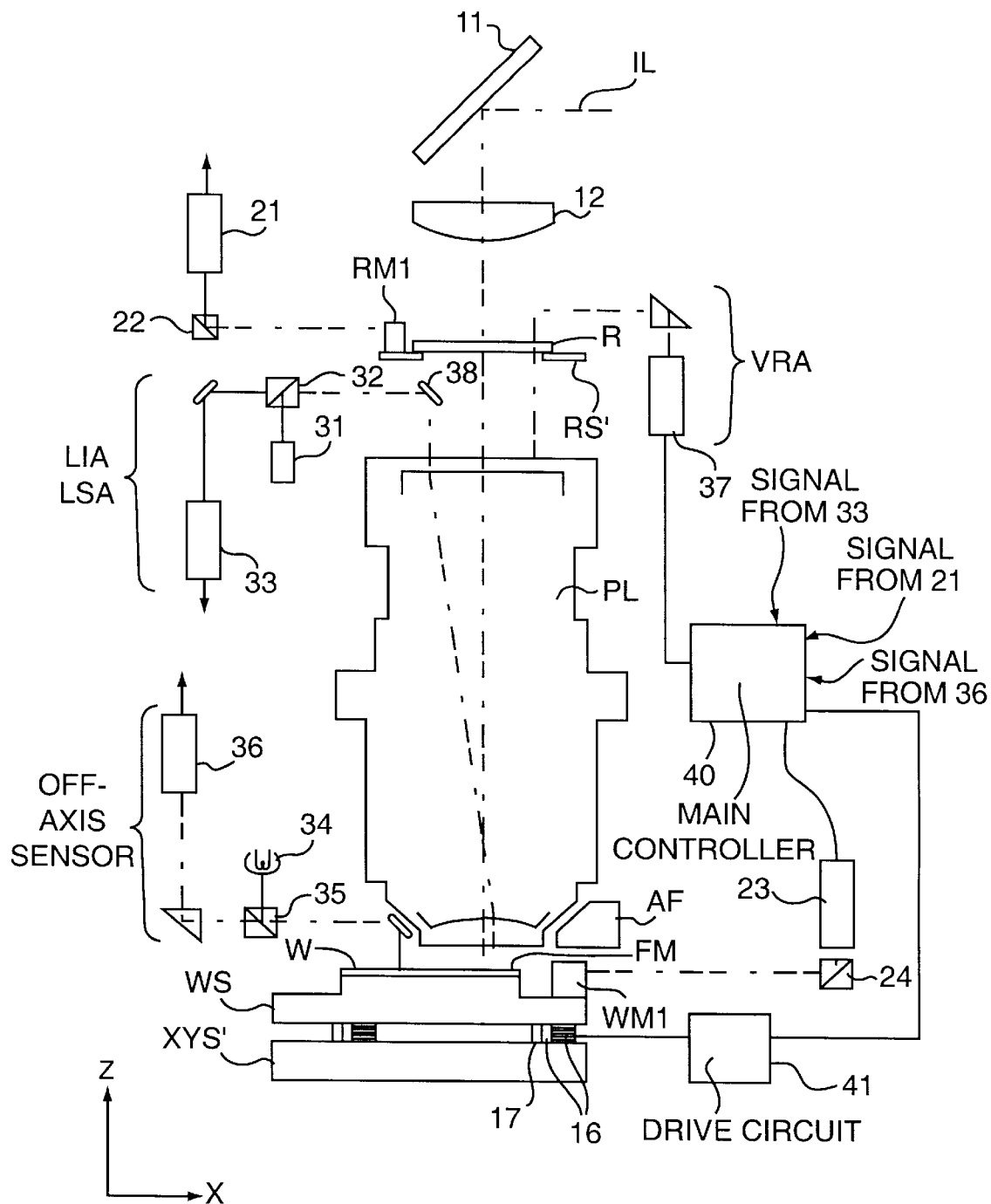
FIG. 1 is a schematic view of a projection exposure apparatus according to a preferred embodiment of the present invention.

FIG. 1 schematically shows a projection exposure apparatus according to a preferred embodiment of the present invention. The Z axis is taken in the direction parallel to the optical axis of a projection lens PL. The X axis is taken parallel to the paper of FIG. 1 in a two dimensional plane perpendicular to the optical axis, and the Y axis is taken in a direction normal to the paper of FIG. 1. Illuminating light IL (exposing light) originates from a light source system, which includes a light source (not shown), an optical integrator (not shown), a dichroic mirror 11, and a condenser lens 12. The light IL illuminates the pattern formation surface (lower plane) of a reticle R with a uniform illumination distribution. The pattern on the reticle R is projected onto a wafer W having a photoresist thereon by this illumination light IL through the projection lens PL, whereby the photoresist is exposed.

Operation of Reticle Stage

Reticle R is held on a reticle stage RS. The reticle stage RS is driven with respect to a reticle base (not shown) in the X direction, which is the scanning direction. A mobile mirror RM 1, which extends in the Y direction, is mounted on the reticle stage RS. A laser beam is emitted from a laser interferometer 21 to the mobile mirror RM1 through a mirror 22, and hence the X coordinate of the reticle R is measured. Although not shown in FIG. 1, another mobile mirror RM2 is installed together with another laser interferometer for measuring the position of reticle R in the Y direction.

Figure 2:
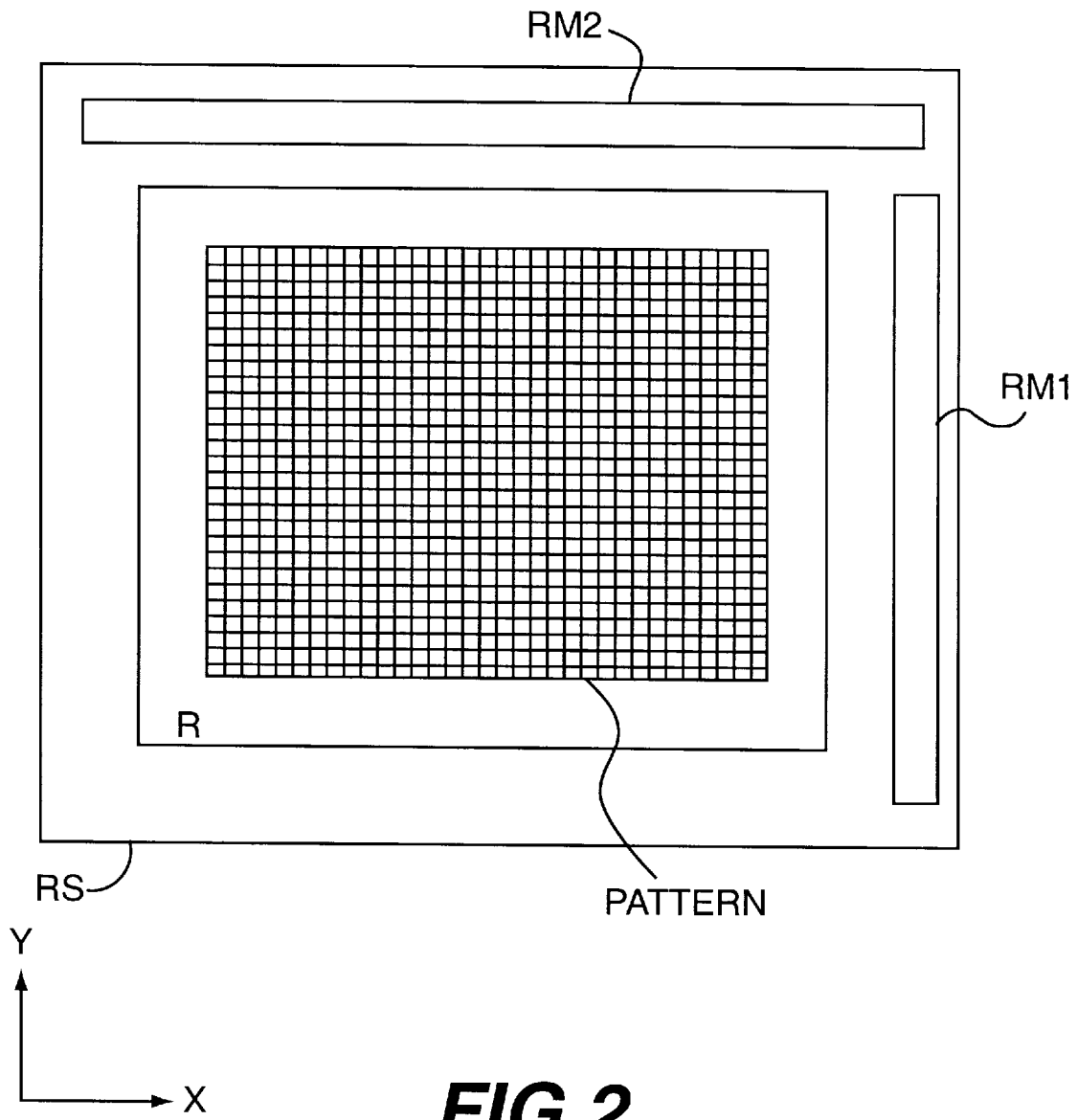
FIG. 2 is a plan view of a reticle stage RS according to the preferred embodiment of the present invention.

FIG. 2 is a plan view of the reticle R and the reticle stage RS as viewed from the incident direction of the illuminating light IL. The mobile mirror RM2, which extends in the X direction, is mounted on the reticle stage RS. A laser beam is guided to the mobile mirror RM2, and the Y coordinates of the reticle R are thereby measured.

Operation of the Wafer Stage and Auto Focus (AF)

The wafer W is held on a wafer stage WS through a wafer holder (not shown in the figure). The wafer stage WS is mounted on an XY stage XYS through three or more actuators 16 (laminated piezoelectric device, for example), each of which is movable in the Z direction. A drive circuit 41 controls these actuators 16. The vertical positioning (focal position) of the wafer stage WS (in the Z direction) is performed by adjusting the strokes of the actuators 16 by roughly the same amount. The tilt angle of the wafer stage WS around the X and Y axes are controlled by adjusting the strokes of the actuators 16 independently. A linear encoder 17 of an optical type, an electric capacitance type, or the like is attached adjacent each actuator to detect the position of the wafer stage WS in the Z direction.

Figure 3:
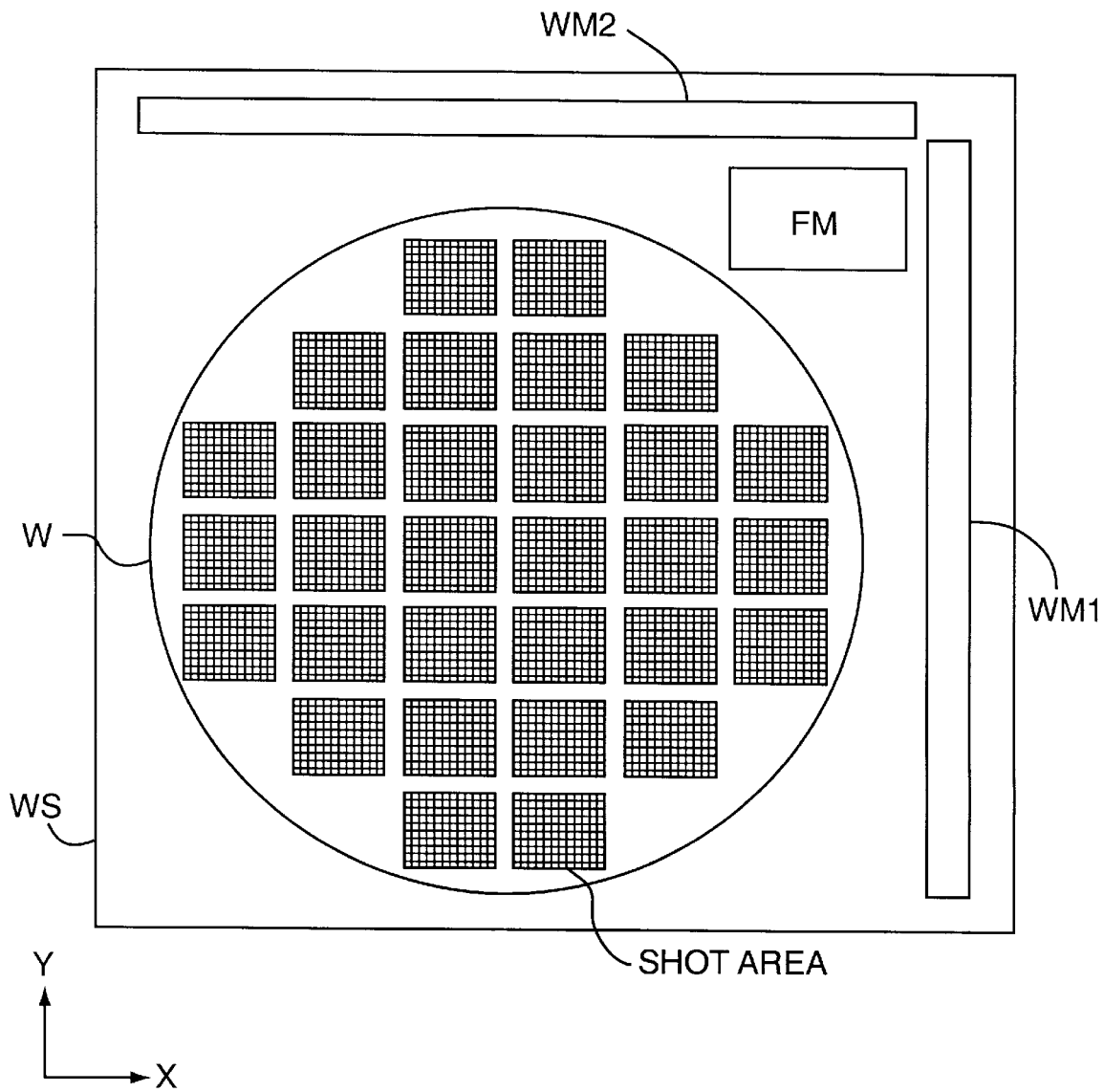
FIG. 3 is a plan view of a wafer stage RW according to the preferred embodiment of the present invention.

The XY stage XYS is mounted on an apparatus base (not shown) through a linear motor or the like to be movable in the X and Y directions. In addition, a mobile mirror WM1 for the X direction and a mobile mirror WM2 for the Y direction are fixed on the wafer stage WS. In FIG. 1, the mobile mirror WM2 for the Y direction is omitted. A laser beam from a laser interferometer 23 is guided to these mobile mirrors WM1 and WM2 through a mirror 24, and accordingly the X coordinates and the Y coordinates of the wafer W are constantly monitored. FIG. 3 shows a plan view of the wafer W and the wafer stage WS as viewed from the projection lens PL side.

With reference to FIG. 1, on one side of the projection lens PL, a focus position detection system (referred to as AF sensor) is installed for detecting the position (focus position) of the wafer surface in the Z direction. The AF sensor is constructed of a light transmission system (AF in FIG. 1) and a light receiving system (not shown in FIG. 1). The light receiving system is arranged on the opposite side of the light transmission system. Light that is insensitive to the photoresist (referred to as detection light) is emitted from the light transmission system. The detection light illuminates a plurality of slits, and the image of these slits are projected onto the wafer W in the oblique direction with respect to the optical axis of the projection lens PL. The light receiving system detects the detection light reflected from the wafer W to determine the height of each slit image on the wafer surface. The strokes of actuators 16 are controlled so as to change the position of wafer W in the Z direction. The AF sensor monitors the height of the wafer surface and compares the detected surface position with a predetermined position of the best focus position. Typically, the AF sensor outputs a predetermined signal when the detected surface position corresponds to the best focus position. Because of this, the above operation of detecting the vertical position of the wafer is also referred to as focus position detection. Moreover, since the AF sensor has a plurality of detection points, the tilt angle of the wafer W can also be detected.

Measurement of Baseline Amount for Various Alignment Sensors

In addition, the projection exposure apparatus of the present embodiment is equipped with an alignment system including various types of optical alignment sensors. Specifically, a video reticle alignment (referred to as VRA) sensor is installed as a through-the-reticle (TTR) type sensor. A laser-step-alignment sensor (LSA sensor) and a laser-interferometric-alignment sensor (LIA sensor), both of which are through-the-lens (TTL) type, are installed as wafer alignment sensors. Moreover, an off-axis type sensor is also installed (FIG. 1).

In this embodiment, the LIA, LSA, and off-axis sensors are installed to detect the position of the wafer so that the wafer can be aligned with the reticle pattern image formed on the exposure area with high accuracy. Each of such wafer alignment sensors has a reference point in its detection areas, through which the wafer position is determined. On the other hand, the VRA sensor is installed to measure the position of the reticle pattern image formed on the exposure area through the projection optical system (lens). To achieve highly accurate alignment of the reticle pattern image with the wafer, it is necessary to obtain the precise positional relationship between these reference points of the wafer alignment sensors and a reference point in the reticle pattern image formed through the projection optical system (center of exposure, for example). This positional relationship is referred to as "baseline amount."

As shown in FIGS. 1 and 3, a fiducial mark FM is installed on the wafer stage WS at the same height as the wafer W. A VRA mark is formed on the fiducial mark FM for use of the VRA sensor. In addition, various marks for use in measuring the baseline amounts of the above-mentioned LSA, LIA, and the off-axis type sensors are formed on the fiducial mark FM. These marks are formed at predetermined positions with respect to the VRA mark.

The VRA sensor 37 radiates alignment light having the same wavelength as the exposure light to illuminate through the projection lens the VRA mark (crisscross-shaped mark) on the fiducial mark FM and a VRA mark (crisscross-shaped mark) formed on the reticle R. The VRA sensor 37 receives the reflected light with a charge coupled device (CCD) or the like and performs image processing. This way, the VRA mark on the fiducial mark FM and the VRA mark on the reticle R are simultaneously observed. The XY stage XYS is moved so as to match these VRA marks with each other: offsetting the deviation of the one from the other in the X and Y directions. Alternatively, the deviation of the VRA mark on the fiducial mark FM from the VRA mark on the reticle R in the X and Y directions itself may be measured by the CCD and stored in a memory as such. In either way, the VRA sensor measures the position of the reticle pattern image or the position of the reference point in the image in a coordinate system fixed to the wafer stage. This is equivalent to determining the position of the reference point of the projection optical system (lens) PL in its exposure area.

When the VRA mark is observed with the VRA sensor 37, a grid-shaped mark on the fiducial mark FM for use of the LIA is positioned such that a laser flux of the LIA sensor illuminates that grid-shaped mark. Accordingly, the position of a reference point of the LIA sensor in its detection area can be detected through the laser flux from the LIA sensor by measuring deviations of the reference point from a predetermined position in the X and Y directions. Also in this condition, a crisscross-shaped alignment mark for use of the off-axis type sensor on the fiducial mark FM is arranged such that light with a broad wavelength bandwidth illuminates that mark. Accordingly, the position of a reference point of the off-axis type sensor in its detection area can be derived by detecting the positional deviation of the reference point from a predetermined position in the X and Y directions. Here, the LIA method and the off-axis method detect respective sensor marks while the wafer stage WS is at rest, and the LSA method detects the sensor mark while the wafer stage WS is on the move (scanning). A grid-shaped mark for use of the LSA is formed on the fiducial mark FM at a predetermined position with respect to the VRA mark. The positional deviation of the reference point from a predetermined position is measured through the laser interferometer 23 in the X and Y directions, and thereby the position of a reference point of the LSA sensor in its detection area can be derived.

Once the positions of the above-mentioned reference points for alignment sensors are derived, the spacing between the reference point of each alignment sensor in its detection area and the reference point of the projection optical system in its exposure area can be obtained. This positional difference is referred to as "baseline amount." Below, each alignment sensor will be explained in detail.

First, the LSA sensor will be explained in more detail. The laser beam emitted from the laser light source 33 passes through the beam splitter 32 and optical elements, such as a cylindrical lens and a field stop (both are not shown in FIG. 1). The laser beam is then reflected at a reflecting mirror 38 and enters the projection lens PL. The laser beam is shaped into a long extended elliptical spot light and illuminates the fiducial mark FM on which a grid-shaped mark is formed. The spot light and the grid-shaped mark are moved relative to each other, and at the moment that the spot light illuminates the grid-shaped mark, scattering light and/or diffraction light are created. The scattering light and/or the diffraction light thus created go back into the projection lens PL and are reflected by the beam splitter 32. The light reflected at the beam splitter 32 enters the light receiving surface of a photoelectric detector 31. The position of the wafer stage WS is measured at the laser interferometer 23, and the position of the reference point of the LSA sensor in its detection area can be determined. As stated above, during the LSA detection, the wafer stage WS is on the move (scanning). The details of the LSA method are discussed in Japanese Laid-Open Publication No. 60-130742, for example.

Next, the heterodyne type LIA sensor will be explained in more detail. Since the components of the LIA sensor are similar to that of the LSA sensor, the same reference numerals will be used to describe similar components. A laser beam emitted from the laser light source 33 passes through a beam splitter 32, and enters a double light beam frequency shifter which generates two laser beams with different frequency (not shown). The laser beams thus generated (frequencies f1 and f2) are reflected at a reflecting mirror 38, enter the projection lens PL, and illuminate a grid-shaped mark on the fiducial mark FM. Since the two laser beams with different frequencies f1 and f2 are superimposed on the grid-shaped mark, an interference pattern with beat frequency f1–f2 is generated on the fiducial mark FM and moving in a predetermined direction. This interference pattern together with the grid-shaped mark generates diffraction light. The diffraction light goes back to the projection lens PL and is detected at a photoelectric detector 31. On the other hand, the laser beams illuminate a reference grid-shaped mark installed separately (not shown), and another diffraction light is created. The diffraction light thus created is also received at the photoelectric detector 31, and generates at the detector a phase difference between the diffraction light from the grid-shaped mark on the fiducial mark FM and the diffraction light from the reference grid-shaped mark. The position of the reference point of the LIA sensor in its detection area is detected by processing this phase difference. As stated above, the LIA detection is performed while the wafer stage WS is at rest. The details of the LIA method are discussed in Japanese Lid-Open Publication No. 61-215905.

Next, a wafer alignment sensor of the off-axis type will be explained. On the side of the projection lens PL, an off-axis optical system that bypasses the projection lens PL is attached. In this system, image processing is performed with an image processing device 36, and a crisscross shaped alignment mark on the fiducial mark FM is illuminated by light with a wide wavelength band, such as light of a halogen lamp 34. The position of the reference point of the off-axis alignment sensor in its detection area is obtained through this image processing.

As an alternative method of deriving the position of the reference point of the projection optical system (projection lens PL) in its exposure area, a light emitting component may be attached in the fiducial mark FM instead of using the VRA sensor 37. For example, the light emitting component uses the same exposure light guided from the exposure light source through an optical fiber, and emits the light toward the projection lens PL. A photoelectric detector (not shown in the figure) detects the light that has passed through the projection lens PL and the reticle R. A transparent pattern is formed at a predetermined position of the reticle R. When the wafer stage WS is moved in the X direction (or the Y direction), the exposure light from the light emitting component enters the photoelectric detector at the moment that the light passes through the transmission pattern. When this takes place, the position of the wafer stage WS is measured by the laser interferometer 23 and thereby the position of the reference point in the exposure area of the projection lens PL is determined. The details of this measurement are described in Japanese Laid-Open Publication No. 63-81818.

Using the above-mentioned method, the spacing between the reference point of each alignment sensor in its detection area and the reference point in the exposure area of the projection lens PL, i.e., baseline amount, can be determined.

Measurement of Baseline Amount for Exposure of Contact Holes

In the present embodiment, when contact holes are exposed, the same reticle pattern is exposed on the wafer W while moving the wafer by an amount $+\Delta Z$ or $-\Delta Z$ in the Z direction. The amount $\Delta Z$ can be chosen to the depth of focus, as discussed in Japanese Laid-Open Publication No. 5-13305, however, it may also be determined by other factors, such as the N.A. (numerical aperture) of the projection lens PL, the $\sigma$ value of the illumination system (the ratio of the N.A. of the illumination system to the N.A. of the projection lens), and the diameters of contact holes to be exposed. The present embodiment assumes that the value of $\Delta Z$ be equal to the depth of focus. This amount $\Delta Z$ is stored in a main controller 40 (or main computer) or a host computer that controls a plurality of exposure apparatuses. Alternatively, the amounts $\Delta Z$'s suited for individual reticles forming contact holes may be calculated by the main computer in accordance with various factors described above, i.e., the N. A. of the projection lens, the $\sigma$ value of the illumination system, and the diameter of the contact hole to be exposed, etc.

Moreover, in a one-time projection exposure apparatus, the contact hole exposure is performed while moving the wafer stage WS to three or more predetermined positions in the Z direction, or while moving the wafer stage at a constant speed or at a variable speed. However, with a scanning type projection exposure apparatus, sufficient contact hole exposure can be easily achieved by tilting the wafer W. In other words, the projected area of the reticle R (the illumination slit area, which is normally smaller than one shot area) is tilted towards the scanning direction (X direction, for example) while the shot area portion is scanned. By so doing, it becomes possible to expose contact holes with the effective focal depth increased two to three times.

Operation of baseline measurement suitable for contact hole exposure according to the present embodiment will be explained next. First, light transmission system of the AF sensor emits the detection light toward the fiducial mark FM. The light receiving system of the AF sensor receives the detection light reflected at the fiducial mark FM, thereby detecting the height of the fiducial mark FM (the position of the mark in the Z direction). The wafer stage WS is elevated and tilted to match the surface of the fiducial mark FM with the predetermined best imaging plane (best focal plane). (Normally, these operations are automatically conducted: hence auto focus (AF) sensor.)

Even when the baseline amount is measured under this condition, the measured baseline is not accurate unless the optical axis of the projection lens PL and the optical axis of the alignment sensor, to which the baseline amount is measured, are precisely telecentric between Z coordinate positions $Zc-\Delta Z$ and $Zc+\Delta Z$. Here, $Zc-\Delta Z$ represents a vertical position that is focal depth amount $\Delta Z$ lower than the best focus position, and $Zc+\Delta Z$ represents a position that is focal depth amount $\Delta Z$ higher than the best focus position. Therefore, after tilting the wafer W in such a way that the wafer surface becomes parallel to the projection plane of the reticle R and after finding the best focal plane, the following methods are employed.

First Method

In the first method of contact hole exposure, the wafer stage WS is moved in the Z direction to the position $Zc-\Delta Z$ (which is the focal depth amount lower than the best focus position) and the contact hole exposure is performed there. The wafer stage WS is then moved to the best focus position Zc, and the exposure is performed. Finally, the wafer stage WS is moved in the Z direction to the position $Zc+\Delta Z$ (which is the focal depth amount higher than the best focus position) and the exposure is performed in this state. This way, an effective focal depth can be increased.

Figure 4A:
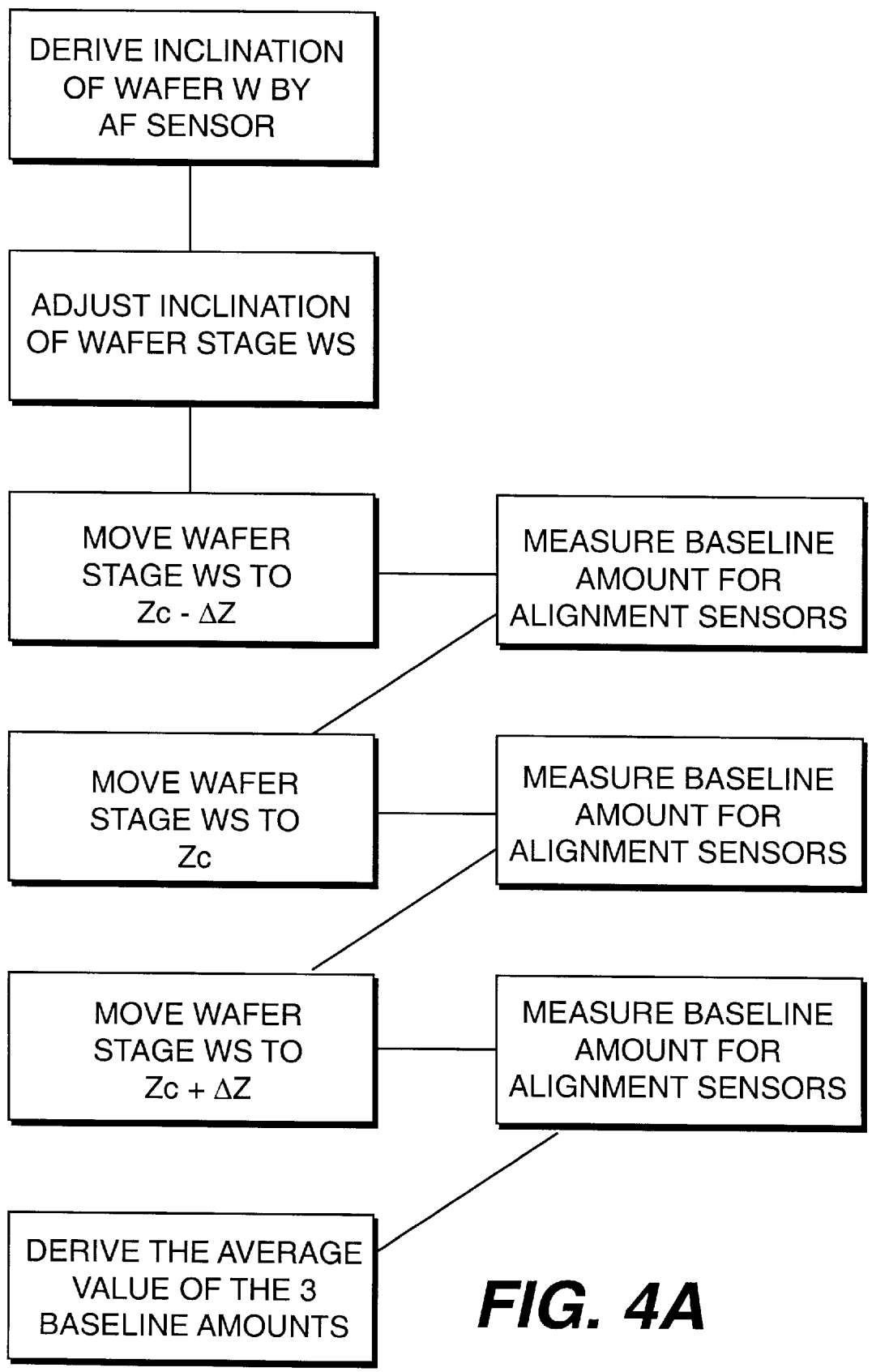
FIGS. 4A and 4B are flow charts showing methods of measuring the baseline amount according to the preferred embodiment of the present invention.

In this case, by measuring the baseline amounts at these three points $(Zc-\Delta Z)$, $Zc$, $(Zc+\Delta Z)$ and taking an average, an average baseline amount more suitable for contact hole exposure can be obtained. In other words, as shown in FIG. 4A, the baseline amount for each of the alignment sensors is measured when the wafer stage WS is moved to a position $Zc-\Delta Z$ (which is the focal depth amount lower than the best focus position). The baseline amount is also measured after moving the wafer stage WS to the best focus position Zc. In addition, the baseline amount is measured when the wafer stage WS is moved to the position $(Zc+\Delta Z)$, which is the focal depth amount higher than the best focus position. The average of these three baseline amounts can be used as the averaged baseline amount of each alignment sensor at the time of contact hole exposure.

This baseline determination is not limited to three positions $Zc-\Delta Z$, $Zc$, $Zc+Z$ above, but the number of the positions in the Z direction, where the baseline amount is measured, may be increased to five (5) to ten (10) points, for example.

Second Method

In the second method of contact hole exposure, the exposure is performed while moving at a constant speed or at a variable speed the wafer stage WS in the Z direction from the position $(Zc-\Delta Z)$ to the position $(Zc+\Delta Z)$ to increase the effective focal depth.

Figure 4B:
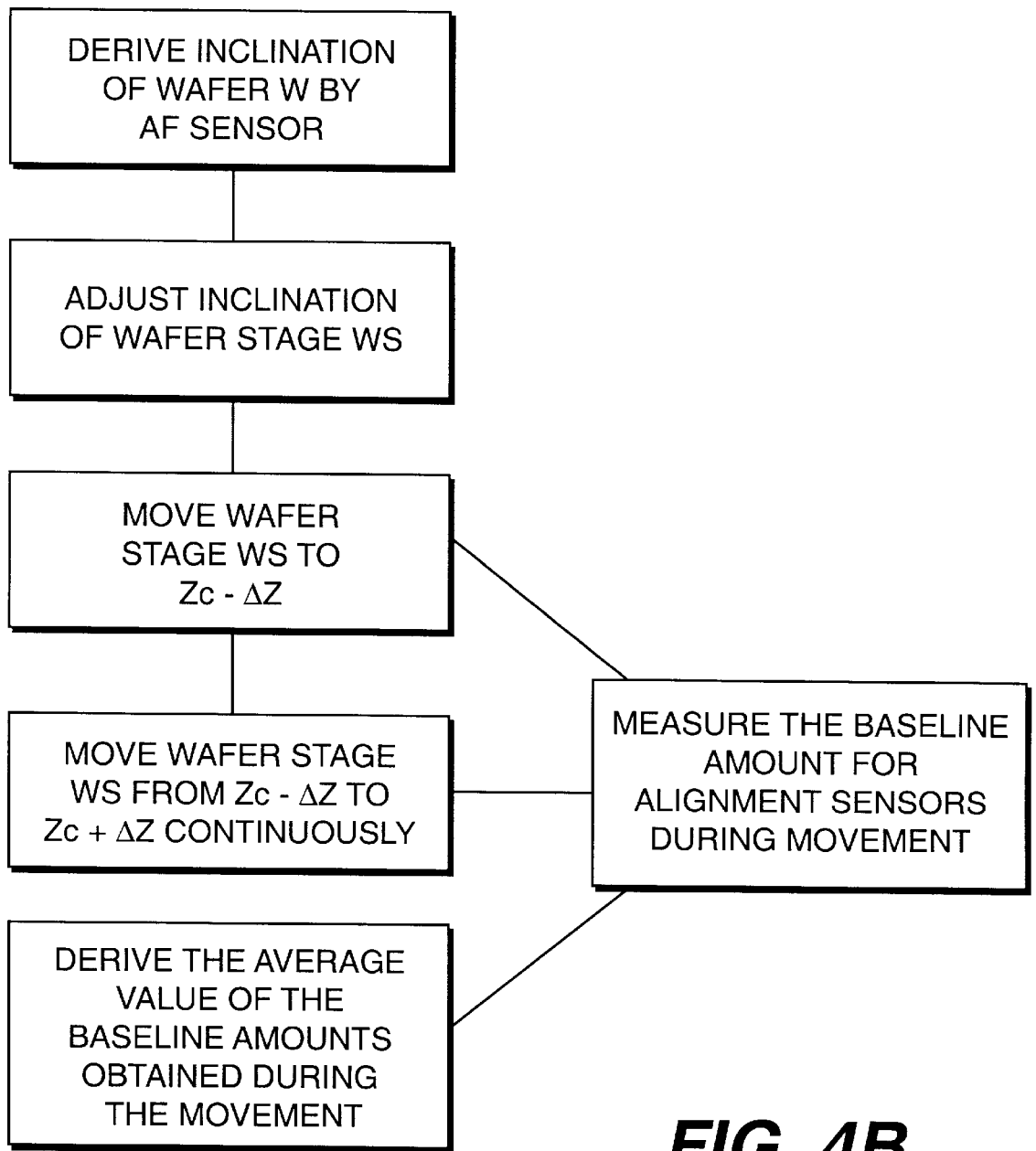
Figure 5:
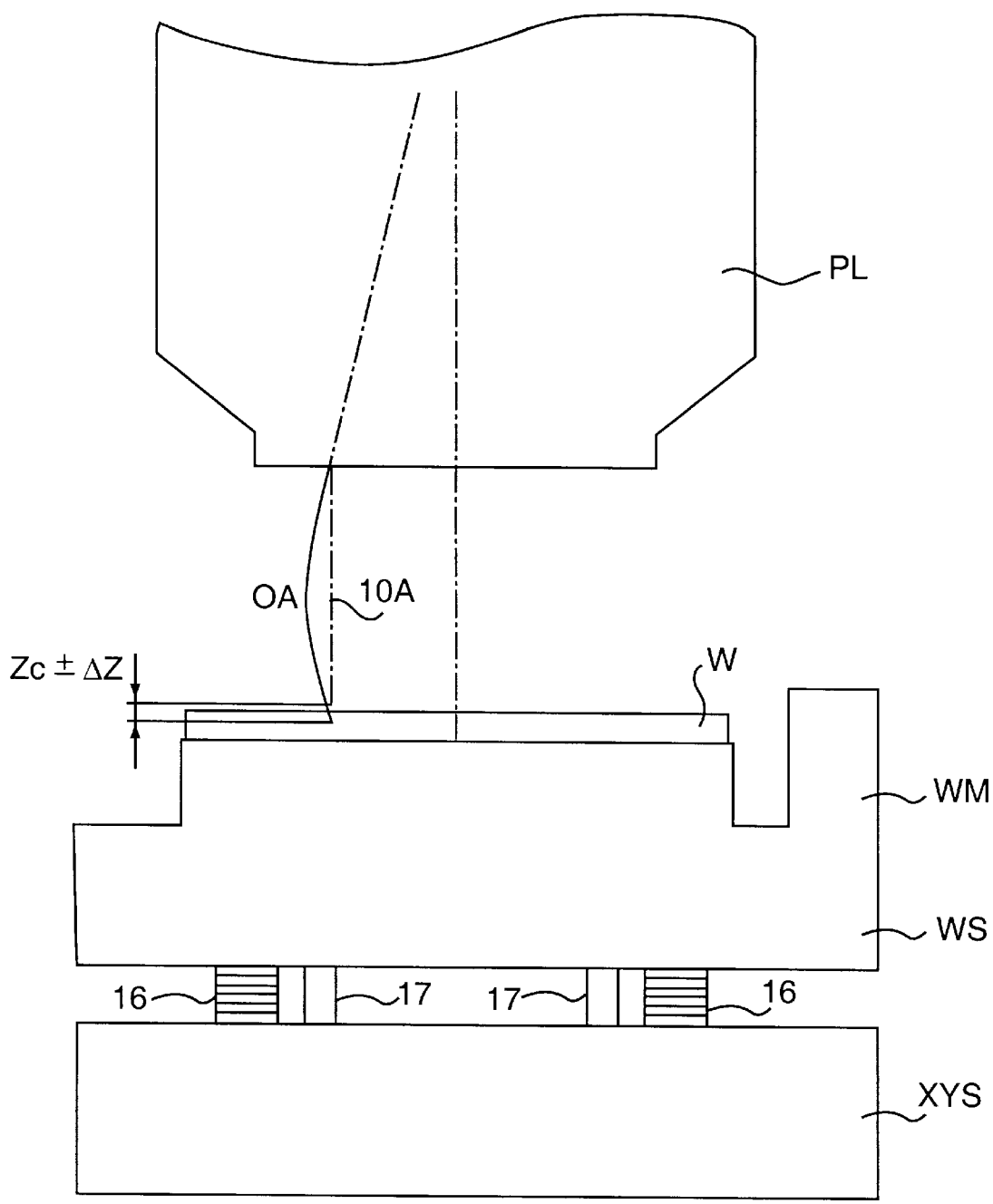
FIG. 5 shows the optical axis of a projection lens in the imaging space between the projection lens and a wafer.
Figure 6:
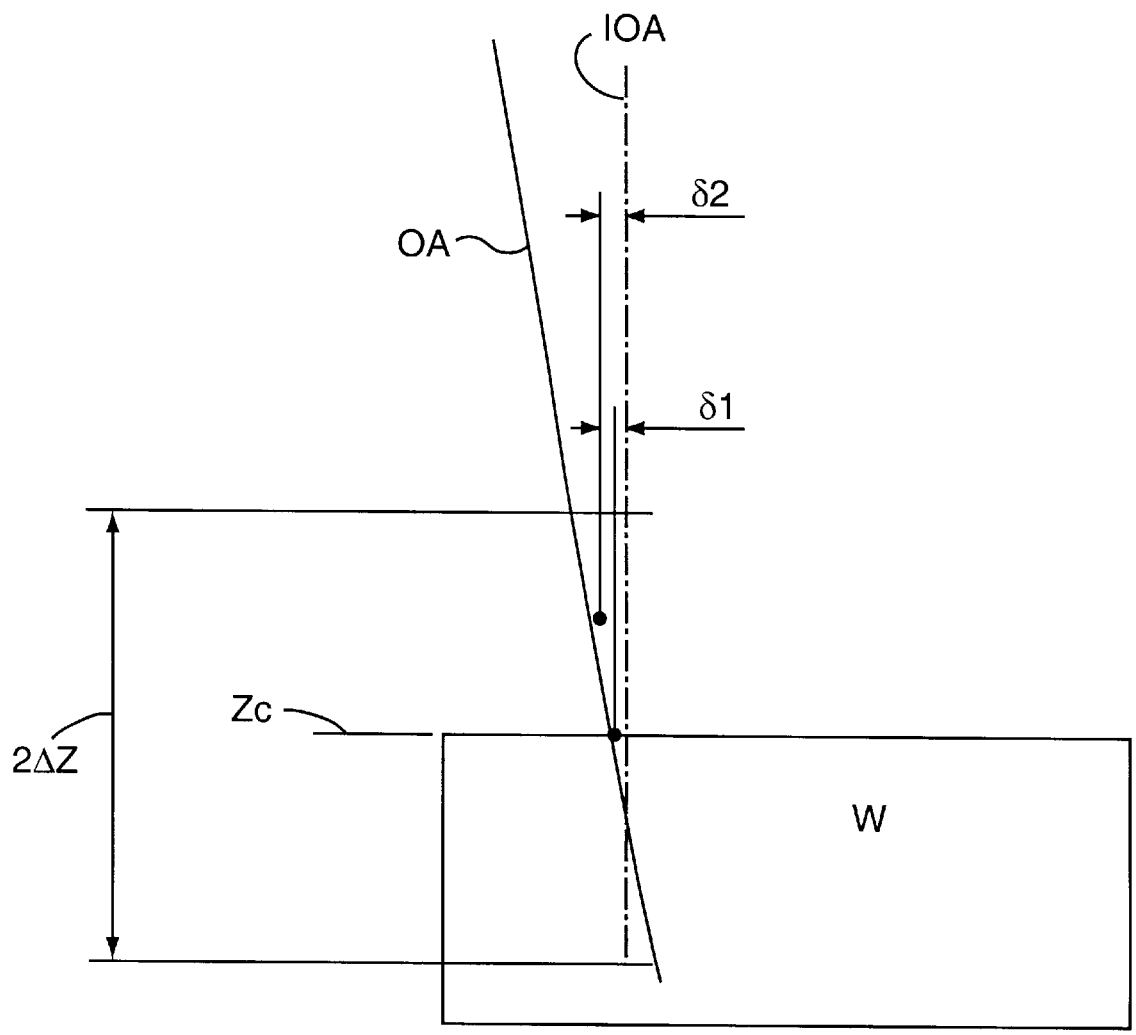
FIG. 6 is a magnified view of the imaging space of FIG. 5 adjacent the wafer.

The method to derive the averaged baseline amount between the position $Zc-\Delta Z$ and the position $Zc+\Delta Z$ is shown in FIG. 4B. As shown in the flow chart of FIG. 4B, the baseline amount for each of the alignment sensors is measured while moving the wafer stage WS.

A typical LIA sensor can perform sampling of signals every 20 $\mu$s, assuming the frequency difference between double laser beams (beat frequency f1–f2) be 50 kHz (1/50 kHz=20 $\mu$s). However, the VRA sensor and the off-axis type sensor normally employ an interlacing type image signal processing method, and accordingly signals are being sampled only every 1/30th of a second.

Because of these limitations, when attempting to measure the baseline amount for the VRA sensor and the off-axis type sensor within the typical time period for the contact hole exposure (e.g., 100 ms), the baseline amount can be measured only two to three times. Accordingly, when determining the average baseline amount for the VRA sensor and the off-axis type sensor, it is preferable that the wafer stage WS be moved at a slower speed; for example, spending 300 ms to 500 ms to move the wafer stage WS from the position $Zc-\Delta Z$ (which is the focal depth amount lower than the best focus position) to the position $Zc+\Delta Z$ (which is the focal depth amount higher than the best focus position). In so doing, a better average baseline amount for each sensor can be derived. If the VRA sensor and the off-axis type sensor employ a non-interlacing image signal processing method, signals can be sampled every 1/60th of a second. It is also possible to modify interlacing-type sensors in such a way as to change their sampling rates to 1/60th of a second when the baselines are measured.

In addition, if the photoelectric detector in the VRA sensor or the off-axis type sensor is a charge coupled device (CCD), then the average baseline amount can be measured by modifying the CCD such that it can continuously store charges corresponding to the received light amount up to its over-flow value while the wafer stage WS moves from the position $Zc-\Delta Z$ to the position $Zc+\Delta Z$.

Scanning operation is employed in the case of the LSA method and in the case of detecting the reference point of the projection lens PL in its exposure field by the exposure light emitted from the light emission component of the fiducial mark FM. Thus, a single result is obtained by each horizontal scanning operation. Accordingly, the wafer stage WS cannot be moved vertically during such measurement. In these methods, the wafer stage WS is moved in the Z direction upon completing each scan. Thus, the first method (FIG. 4A), rather than the second method (FIG. 4B), is suitable for the baseline measurement.

EGA Measurement for Exposure of Contact Holes

Expansion and contraction may occur in the wafer W due to heat treatment or the like in the course of fabricating devices on the wafer. The XY stage XYS may have some deformation in itself, such as orthogonality errors, etc. Because of these, each shot area (chip) exposed on the wafer W may not be placed at the predetermined design position. To solve this problem, separate alignment for each shot area may be performed (referred to as Die by Die alignment or D/D). This method has low throughput, however. To improve the throughput, an enhanced global alignment method (EGA) has been proposed (see, e.g., Japanese Laid-Open Publication No. 61-44429). In the EGA, the positions of alignment marks are measured only at several shot areas among all the shot areas formed in a wafer by exposure, and are compared with the calculated (or design) positions. Further, the differences between the measured values and the calculated values are statistically processed by the least square method. A weighted EGA, which assigns some appropriate weights to residual errors, has been proposed as another type of EGA method. This method is a half way between the EGA above and the D/D. In these types of EGA, the above-mentioned LIA, LSA, and off-axis sensors detect the positions of the alignment marks at several shot areas selected among all the shot areas exposed on the wafer.

In this EGA method, the reference point of each alignment sensor in its detection area may not be precisely telecentric in the space between the position $Zc-\Delta Z$ (which is the focal depth amount lower than the best focus position) and the position $Zc+\Delta Z$ (which is the focal depth amount higher than the best focus position). To solve this problem, the present embodiment measures the positions of alignment marks at a plurality of vertical wafer positions in a similar manner to the first and second methods of measuring the baseline amount for exposing contact holes described above. In other words, in the first method, the positions of the alignment marks at each shot area are measured by each alignment sensor at three (3) different vertical positions of the wafer stage WS, and are averaged over the three positions to derive the averaged EGA values (EGA data) to be used in the least square method. In the second method, the positions of the alignment marks at each shot area are measured by the LIA sensor and the off-axis sensor while moving the wafer stage WS in the Z direction at a constant speed or at a variable speed, and are averaged to yield the EGA values (EGA data) to be precessed by the least square method. This way, accurate or preferable measured values can be obtained.

According to the present invention, since the baseline amounts is measured in advance through moving the reference mark within the predetermined range in the direction of the optical axis, a baseline measurement that is suited for the exposure of the contact hole in the case of moving the wafer W within that predetermined range in the direction of the optical axis can be obtained.

Furthermore, the position determination method for statistical processing of the position determination of the wafer W by the least-square method includes a process for detecting the best focus position of the projection lens, and a process to move the wafer W or the best focus position in the direction of the optical axis of the projection lens within the predetermined range ($\pm\Delta Z$) from the best focus position ($Zc$) while confirming the positions of the plurality of shot areas.

Accordingly, accurate or preferable values, which are more suited for the exposure of the contact hole than the simple statistical processing of the position determination of the wafer W using the least-square method, can be obtained.

Further, the projection exposure apparatus comprises an AF sensor which detects the best focus position ($Zc$) of the projection lens, and a driving system (a drive circuit 41 and actuators 16, for example) which drive the wafer W or the best focus position ($Zc$) in the direction of the optical axis (Z axis direction) of the projection lens PL within the predetermined range ($\pm\Delta Z$) from the detected best focus position ($Zc$), and an alignment sensor which detects the position of the wafer W at the time the wafer W or the best focus position is moved within the predetermined range ($\pm\Delta Z$). The predetermined range ($\pm\Delta Z$) can be chosen to be the same as the amount that the wafer W is moved in the direction of the optical axis of the projection lens at the time the projection exposure apparatus exposures the contact hole.

In the embodiment above, the wafer stage WS is moved from the position $Zc-\Delta Z$ to the position $Zc+\Delta Z$. Movement in the reverse direction is also possible as it is obvious.

In the above embodiment, description was provided as if the baseline amounts for all the alignment sensors needs to be measured. In actuality, this is not necessary and one alignment sensor may be selected for the baseline amount measurement depending on the particular layered structure of the wafer W being exposed. For example, the baseline measurement only for the LSA sensor is sufficient in some occasion, and omitting baseline measurement for the other sensors leads to saving time. The measurement of the positions of the alignment marks for each shot area in the EGA method may be performed in a similar manner.

Further, in the above embodiment, the wafer stage WS is moved vertically (in the Z direction). Alternately, an effective focal depth for exposing contact holes can be increased by changing the focal position of the projection lens PL itself. In this case, the baseline amount needs to be measured at each focal position. For example, the following two methods can be used to change the focal position: (1) moving the focusing lens in the direction of the optical axis, and (2) sealing a predetermined air chamber (e.g., the space between nth lens and n+1th lens among a plurality of lenses) within the projection lens PL, and adjusting the pressure in such an air chamber to change the focal position of the projection lens PL. In these cases, the average baseline amount can be obtained in a similar manner to that in the above embodiment, i.e., by averaging the baseline amounts measured between the position $Zc-\Delta Z$ (which is the focal depth amount lower than the best focus position) and the position $Zc+\Delta Z$ (which is the focal depth amount higher than the best focus position).

The above description has mostly assumed a one-time projection exposure apparatus employing a step and repeat exposure scheme. Nonetheless, the above-mentioned measurement of the baseline amount and the determination of the EGA data for use in the least-square method can be applied even to a scanning type projection exposure apparatus, and superior results can be obtained. Also, the present invention is embodied above for the case of exposing contact holes. However, the present invention is generally effective when the depth of focus needs to be increased for the projection lens.

It will be apparent to those skilled in the art that various modifications and variations can be made in the projection exposure apparatus and the method of measuring the baseline amount of the present invention without departing from the spirit or scope of the invention. Thus, it is intended that the present invention cover the modifications and variations of this invention provided they come within the scope of the appended claims and their equivalents.

What is claimed is:

1. A baseline measurement method in a projection exposure apparatus for determining a baseline amount suitable for multiple-level exposure of a photosensitive substrate, a baseline amount representing a positional relationship between a first reference point for an alignment sensor for detecting a position of an alignment mark on the photosensitive substrate with respect to the reference point and a second reference point in a projection area of a projection optical system for projecting an image of a mask pattern on the photosensitive substrate, the baseline measurement method comprising the steps of:

detecting a position of a focused image formed through the projection optical system;

moving the photosensitive substrate relative to the detected position of the focused image in a direction substantially parallel to an optical axis of the projection optical system, the photosensitive substrate being moved to a plurality of predetermined positions adjacent the focused image;

detecting a position of the first reference point for the alignment sensor relative to the second reference point in the projection area of the projection optical system at each of the plurality of predetermined positions as a baseline amount at that position; and processing data representing the baseline amounts detected at the plurality of predetermined positions to derive an optimum baseline amount suitable for the multiple-level exposure of the photosensitive substrate.

2. The baseline measuring method according to claim 1, wherein the step of moving further includes the step of holding the photosensitive substrate at each of the plurality of predetermined positions relative to the focused image.

3. The baseline measuring method according to claim 1, wherein the step of moving includes the step of continuously moving the photosensitive substrate relative to the focused image.

4. The baseline measuring method according to claim 1, wherein the step of processing includes averaging the baseline amounts detected at the plurality of predetermined positions to derive an averaged baseline amount as the optimum baseline amount.

5. A position determination method for determining a position of a photosensitive substrate to be suitable for multiple-level exposure through a projection optical system, the position determination method comprising the steps of:

detecting a position of a focused image formed through the projection optical system;

moving the photosensitive substrate relative to the detected position of the focused image in a direction substantially parallel to an optical axis of the projection optical system, the photosensitive substrate being moved to a plurality of predetermined positions adjacent the focused image;

detecting positions of the plurality of shot areas at each of the plurality of predetermined positions; and processing data representing the detected positions of the plurality of shot areas at the plurality of predetermined positions in accordance with the design positions of the shot areas to determine the position of the photosensitive substrate suitable for the multiple-level exposure.

6. The position determination method according to claim 5, wherein the step of moving further includes the step of holding the photosensitive substrate at each of the plurality of predetermined positions relative to the focused image.

7. The position determination method according to claim 5, wherein the step of moving includes the step of continuously moving the photosensitive substrate relative to the focused image.

8. The position determination method according to claim 5, further comprising the step of exposing the photosensitive substrate while moving the photosensitive substrate in the direction substantially parallel to the optical axis, wherein a moving path of the photosensitive substrate in the step of moving is the same as that for the photosensitive substrate in the step of exposing.

9. The position determination method according to claim 5, wherein the step of processing includes processing the data representing the detected positions of the plurality of shot areas in accordance with the design positions of the shot areas using a least-square method.

10. The position determination method according to claim 5, wherein the step of processing includes the steps of averaging the detected position of each of the shot areas over the plurality of predetermined positions to derive an averaged position of each of the shot areas and processing data representing the averaged positions of the plurality of shot areas in accordance with the design positions of the shot areas to determine the position of the photosensitive substrate suitable for the multiple-level exposure.

11. The position determination method according to claim 10, wherein the step of processing the data representing the averaged positions of the plurality of shot areas includes processing data representing the averaged positions of the plurality of shot areas in accordance with the design positions of the shot areas using a least-square method.

12. A method for determining an optimum baseline amount for an alignment sensor in an exposure apparatus for multiple-level exposure in which a photosensitive substrate is exposed at a plurality of positions disposed along an optical axis of the exposure apparatus adjacent to a best focused image, a baseline amount representing a positional relationship between a reference point with respect to which the alignment sensor detects a position of an alignment mark on the photosensitive substrate and a position of an image to be formed on the photosensitive substrate by the exposure apparatus, the method comprising the steps of:

moving a fiducial mark relative to the best focused image in a direction substantially parallel to the optical axis of the projection optical system, the fiducial mark being moved to a plurality of vertical positions adjacent to the best focused image;

at each of the plurality of vertical positions of the fiducial mark, detecting the fiducial mark through the alignment sensor to derive a baseline amount representing a position of the reference point of the alignment sensor relative to the position of the image which would be formed on the photosensitive if located at that vertical position; and processing data representing the baseline amounts detected at the plurality of vertical positions of the fiducial mark to derive the optimum baseline amount suitable for multiple-level exposure of the photosensitive substrate.

13. The method according to claim 12, wherein the step of moving further includes the step of holding the fiducial mark at each of the plurality of vertical positions relative to the best focused image.

14. The method according to claim 12, wherein the step of moving includes the step of continuously moving the fiducial mark relative to the best focused image.

15. The method according to claim 12, wherein the step of processing includes averaging the baseline amounts detected at the plurality of vertical positions to derive an averaged baseline amount as the optimum baseline amount.

* * * * *